(12) United States Patent
Tomonari et al.

(10) Patent No.: US 10,388,452 B2
(45) Date of Patent: Aug. 20, 2019

(54) COIL COMPONENT AND CIRCUIT BOARD INCLUDING THE SAME

(71) Applicant: TDK Corporation, Tokyo (JP)

(72) Inventors: Toshio Tomonari, Tokyo (JP); Sachiko Takano, Tokyo (JP); Shigeki Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/852,662

(22) Filed: Dec. 22, 2017

(65) Prior Publication Data

US 2019/0006088 A1  Jan. 3, 2019

(51) Int. Cl.
| | |
|---|---|
| *H01F 27/28* | (2006.01) |
| *H01F 27/24* | (2006.01) |
| *H05K 1/18* | (2006.01) |
| *H01F 27/29* | (2006.01) |
| *H01F 27/32* | (2006.01) |
| *H01F 41/12* | (2006.01) |
| *H05K 1/02* | (2006.01) |
| *H01F 17/00* | (2006.01) |
| *H05K 1/11* | (2006.01) |

(52) U.S. Cl.
CPC ..... *H01F 27/2885* (2013.01); *H01F 17/0013* (2013.01); *H01F 27/24* (2013.01); *H01F 27/2847* (2013.01); *H01F 27/292* (2013.01); *H01F 27/323* (2013.01); *H01F 41/122* (2013.01); *H05K 1/0218* (2013.01); *H05K 1/181* (2013.01); *H01F 2027/2857* (2013.01); *H05K 1/111* (2013.01); *H05K 2201/1003* (2013.01)

(58) Field of Classification Search
CPC .. H01F 27/2885; H01F 41/122; H01F 27/323; H01F 27/24; H01F 2027/2857; H05K 1/0218; H05K 2201/1003
USPC .......................................................... 336/200
See application file for complete search history.

(56) References Cited

U.S. PATENT DOCUMENTS

| | | | | |
|---|---|---|---|---|
| 6,094,112 | A * | 7/2000 | Goldberger | H03H 3/00 333/185 |
| 2007/0199734 | A1* | 8/2007 | Kudo | H01F 17/0013 174/255 |
| 2011/0025442 | A1* | 2/2011 | Hsieh | H01F 17/0013 336/200 |
| 2011/0291790 | A1* | 12/2011 | Okumura | H01F 5/003 336/200 |
| 2012/0133472 | A1* | 5/2012 | Nishikawa | H01F 17/04 336/200 |
| 2013/0222101 | A1* | 8/2013 | Ito | H01F 17/04 336/83 |

(Continued)

FOREIGN PATENT DOCUMENTS

JP     1992076006     7/1992

*Primary Examiner* — Sherman Ng
(74) *Attorney, Agent, or Firm* — Young Law Firm, P.C.

(57) ABSTRACT

Disclosed herein is a coil component that includes a coil conductor part, and first and second high permeability parts provided respectively on both sides of the coil conductor part in a coil axis direction. The second high permeability part has a larger thickness in the coil axis direction than the first high permeability part. A low permeability part that segments at least a part of a magnetic path exists between the first and second high permeability parts in an outer diameter area of the coil conductor part when viewed in the coil axis direction.

4 Claims, 5 Drawing Sheets

(56) References Cited

U.S. PATENT DOCUMENTS

2014/0009254 A1* 1/2014 Ohkubo .............. H01F 27/2804
336/192
2015/0145618 A1* 5/2015 Cho ....................... H02H 9/045
333/185

* cited by examiner

COIL COMPONENT AND CIRCUIT BOARD INCLUDING THE SAME

BACKGROUND OF THE INVENTION

Field of the Invention

The present invention relates to a coil component and a circuit board including the same and, more particularly, to a coil component in which magnetic flux leakage to the outside is reduced and a circuit board including the same.

Description of Related Art

A large number of coil components are used in a mobile electronic device such as a smartphone. Along with miniaturization of the mobile electronic device and improvement in performance thereof, the size required of the coil component has been reduced. However, reduction in the size of the coil component involves reduction in the volume of a magnetic member constituting the coil component, with the result that magnetic flux is more likely to leak outside. In addition, when the mounting density becomes high because of miniaturization of each electronic component, the distance between adjacent electronic components is reduced, so that influence of the leakage magnetic flux becomes more prominent.

For example, a coil component described in Japanese Utility Model Application Publication No. H04-076606 has a configuration in which a coil pattern is formed on a green sheet formed of a ferrite magnetic body. In this coil component, a closed magnetic path is formed by the ferrite magnetic body, and thus comparatively less magnetic flux leaks outside. In addition, the size of the coil component is comparatively large (3.6 mm×1.6 mm), so that the volume of a magnetic member constituting the coil component is sufficiently ensured.

However, in recent years, a coil component is required to have a smaller size, which makes it difficult to sufficiently confine magnetic flux in the coil component. In particular, when a low permeability part that segments a part of the magnetic path exists, a large amount of magnetic flux may leak outside from the low permeability part. As described above, such leakage magnetic flux affects other neighboring electronic components more as the mounting density is increased.

SUMMARY

It is therefore an object of the present invention to provide a small-sized coil component in which magnetic flux leakage to the outside is reduced and a circuit board including the same.

A coil component according to the present invention includes a coil conductor part and first and second high permeability parts provided respectively on both sides of the coil conductor part in the coil axis direction. The second high permeability part has a larger thickness in the coil axis direction than the first high permeability part. A low permeability part that segments at least a part of a magnetic path exists between the first and second high permeability parts in the outer diameter area of the coil conductor part when viewed in the coil axis direction.

According to the present invention, the second high permeability part has a larger thickness than the first high permeability part, so that using a surface of the first high permeability part perpendicular to the coil axis as the mounting surface allows spread of magnetic flux leaking from the low permeability part to be suppressed by the second high permeability part.

In the present invention, the low permeability part may be a non-magnetic substrate, and the coil conductor part may be formed on the surface of the non-magnetic substrate. The first or second high permeability part may be a magnetic substrate, the coil conductor part may be formed on the surface of the magnetic substrate, and the low permeability part may be an insulating resin layer that covers the coil conductor part. Further, the first high permeability part may be one of flange parts of a drum-shaped core, and the second high permeability part may be the other one of the flange parts of the drum-shaped core.

A circuit board according to the present invention includes a mounting substrate and the coil component mounted on the mounting substrate such that the mounting surface thereof faces the mounting substrate.

According to the present invention, leakage magnetic flux from the coil component is reduced, enabling high density mounting on the mounting substrate.

In the present invention, the mounting substrate preferably has a ground pattern formed so as to overlap the coil component. With this configuration, leakage magnetic flux to the first high permeability part is shielded by the ground pattern, allowing further reduction in influence that the leakage magnetic flux has on other electronic components.

As described above, according to the present invention, there can be provided a small-sized coil component in which magnetic flux leakage to the outside is reduced and a circuit board having the same, thereby allowing reduction in influence that the leakage magnetic flux has on other electronic components, which in turn enables higher density mounting.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

<First Embodiment>

Figure 1:
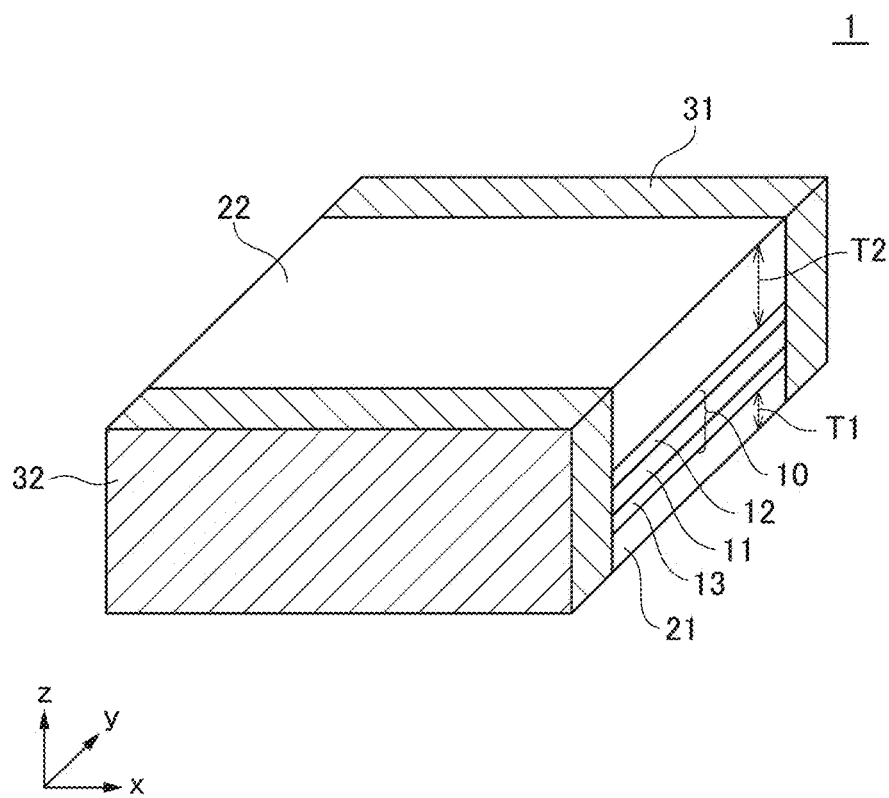
FIG. 1 is a schematic perspective view illustrating the outer shape of a coil component according to a first embodiment of the present invention.

FIG. 1 is a schematic perspective view illustrating the outer shape of a coil component 1 according to the first embodiment of the present invention.

As illustrated in FIG. 1, the coil component 1 according to the present embodiment is a surface-mount type chip component and has a coil layer 10 and first and second magnetic layers 21 and 22 provided on both sides of the coil layer 10 in the illustrated z-direction. The coil component 1 has a substantially rectangular parallelepiped outer shape, and first and second terminal electrodes 31 and 32 are provided on both sides thereof in the illustrated y-direction. The first and second terminal electrodes 31 and 32 are formed not only on the illustrated xz plane, but also on the xy and yz planes. Particularly, on the xy plane, the first and second terminal electrodes 31 and 32 are formed on both the xy plane constituted by the first magnetic layer 21 and xy plane constituted by the second magnetic layer 22. In the coil component 1 according to the present embodiment, the xy plane on the first magnetic layer 21 side is used as a mounting surface. The first and second terminal electrodes 31 and 32 can be formed by, e.g., a dipping method.

The coil layer 10 has a substrate 11 and first and second insulating resin layers 12 and 13 sandwiching the substrate 11 in the z-direction. A coil conductor part to be described later is formed on the both sides of the substrate 11. The substrate 11 and the insulating resin layers 12 and 13 are each formed of a non-magnetic material and constitute a low permeability part.

The first and second magnetic layers 21 and 22 are each a magnetic substrate that constitutes a high permeability part. The high permeability part is a part that is formed of a material having higher permeability than the above low permeability part. As a material for the first and second magnetic layers 21 and 22, a bulk magnetic material such as ferrite, or a metal magnetic powder-containing resin material obtained by mixing metal magnetic powder in resin can be used. The first and second magnetic layers 21 and 22 may be formed of the same material or mutually different materials but need to be each formed of a material having high permeability than materials constituting at least the substrate 11 and insulating resin layers 12 and 13, respectively. When the metal magnetic powder-containing resin material is used as the material of each of the first and second magnetic layers 21 and 22, a permalloy-based material is preferably used as the metal magnetic powder, and liquid or powder epoxy resin is preferably used as the resin.

As illustrated in FIG. 1, a thickness T2 of the second magnetic layer 22 in the z-direction is larger than a thickness T1 of the first magnetic layer 21 in the z-direction. Accordingly, the coil layer 10 is disposed offset to the mounting surface side.

Figure 2:
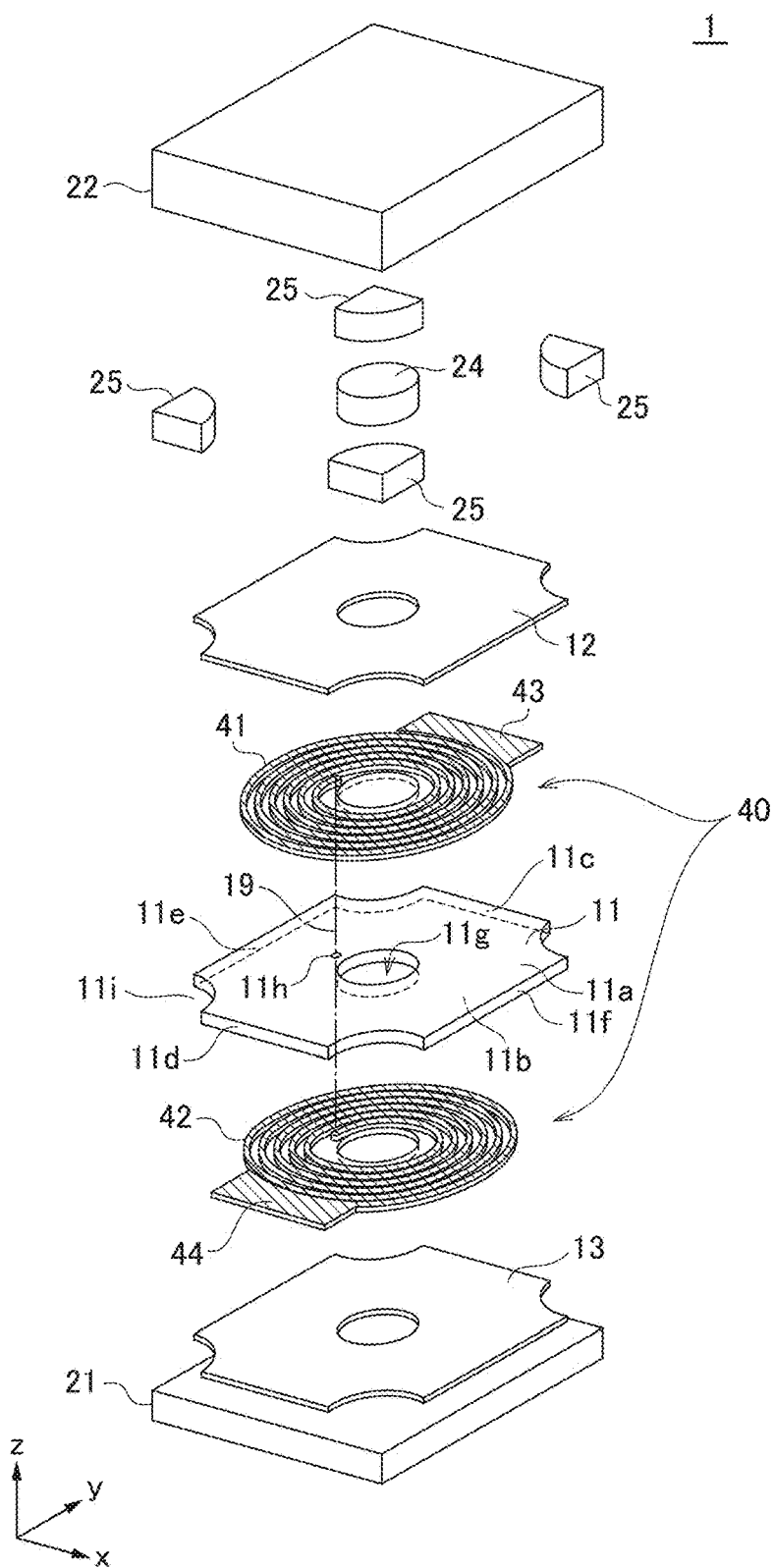
FIG. 2 is a schematic exploded perspective view of the coil component shown in FIG. 1.

FIG. 2 is a schematic exploded perspective view of the coil component 1. In FIG. 2, the first and second terminals 31 and 32 are omitted.

As illustrated in FIG. 2, the substrate 11 has an upper surface 11a and a lower surface 11b. A first spiral conductor 41 and a first electrode pattern 43 are formed on the upper surface 11a of the substrate 11, and a second spiral conductor 42 and a second electrode pattern 44 are formed on the lower surface 11b. The first and second spiral conductors 41 and 42 constitute a coil conductor part 40. The coil axis of the coil conductor part 40 extends in the z-direction.

The substrate 11 has a substantially rectangular shape when viewed in the z-direction and has two side surfaces 11c and 11d extending in the x-direction and two side surfaces 11e and 11f extending in the y-direction. The substrate 11 has through holes 11g and 11h formed therein and has, at its four corners, four quarter-round shaped cutout parts 11i obtained by chamfering the four corners.

The first spiral conductor 41 is formed on the upper surface 11a of the substrate 11, and the second spiral conductor 42 is formed on the lower surface 11b of the substrate 11. The inner peripheral ends of the first and second spiral conductors 41 and 42 are located at the same position when viewed from the z-direction and are connected to each other through a through hole conductor 19 penetrating through the through hole 11h. The outer peripheral ends of the first and second spiral conductors 41 and 42 are located at the opposite positions with the main parts thereof interposed therebetween. Specifically, the outer peripheral ends of the first spiral conductor 41 is located near the side surface 11c of the substrate 11, and the outer peripheral ends of the second spiral conductor 42 is located near the side surface 11d of the substrate 11.

The first and second spiral conductors 41 and 42 are wound in the opposite directions. That is, when viewed from the upper surface 11a side of the substrate 11, the first spiral conductor 41 is wound counterclockwise (left-handed) from the inner peripheral end thereof to the outer peripheral end, while the second spiral conductor 42 is wound clockwise (right-handed) from the inner peripheral end thereof to the outer peripheral end. With this winding structure, when current is made to flow from one of the outer peripheral ends of the first and second spiral conductors 41 and 42 to the other one of them, the current flowing in the first and second spiral conductors 41 and 42 generates magnetic fields of the same direction to intensify them. Thus, the coil conductor part 40 constituted of the first and second spiral conductors 41 and 42 functions as a single inductor.

The first electrode pattern 43 is formed on the upper surface 11a of the substrate 11 and connected to the outer peripheral end of the first spiral conductor 41. The first electrode pattern 43 is located outside the outermost peripheral turn of the first spiral conductor 41, and the xz plane thereof is connected to the first terminal electrode 31 illustrated in FIG. 1. The second electrode pattern 44 is formed on the lower surface 11b of the substrate 11 and connected to the outer peripheral end of the second spiral conductor 42. The second electrode pattern 44 is located outside the outermost peripheral turn of the second spiral conductor 42, and the xz plane thereof is connected to the second terminal electrode 32 illustrated in FIG. 1.

The first and second spiral conductors 41 and 42 and the first and second electrode patterns 43 and 44 are formed at the same time through a process of forming a base conductor layer by electroless plating and then an electrolytic plating. Both a material of the base conductor layer and a plating material used in the electrolytic plating are preferably copper (Cu).

The first spiral conductor 41 and first electrode pattern 43 formed on the upper surface 11a of the substrate 11 are covered by the insulating resin layer 12. The second spiral conductor 42 and second electrode pattern 44 formed on the lower surface 11b of the substrate 11 are covered by the insulating resin layer 13. The insulating resin layers 12 and 13 prevent electrical conduction between the conductor patterns on the substrate 11 and the first and second magnetic layers 21 and 22 and function as an adhesive layer therebetween.

As illustrated in FIG. 2, the through hole 11g is formed at the center of the substrate 11, and the quarter-round shaped cutout parts 11i are formed at the four corners of the substrate 11. The insulating resin layers 12 and 13 each also have a through hole and cutout parts at positions overlapping the through hole 11g and the cutout parts 11i in a plan view. A magnetic member 24 is disposed corresponding to the through hole 11g and magnetic members 25 are disposed corresponding to the respective cutout parts 11i. Thus, the first and second magnetic layers 21 and 22 are magnetically connected to each other through the magnetic members 24 and 25, whereby a closed magnetic path structure can be obtained. As a material for the magnetic members 24 and 25, a metal magnetic powder-containing resin material is preferably used.

The magnetic member 24 constitutes a magnetic path in the inner diameter area of the coil conductor part 40, and the magnetic members 25 constitute a magnetic path in the outer diameter area of the coil conductor part 40. The inner diameter area refers to an area surrounded by the coil conductor part 40 when viewed in the coil axis direction (z-direction), and the outer diameter area refers to an area outside the coil conductor part 40 when viewed in the coil axis direction (z-direction). As illustrated in FIG. 2, the magnetic member 25 is partially disposed at four positions outside the coil conductor part 40, and in portions where the magnetic member 25 does not exist, the magnetic path is segmented by the substrate 11 and the insulating resin layers 12 and 13. In the portions where the magnetic member 25 does not exist, the substrate 11 and the insulating resin layers 12 and 13 are exposed outside, so that leakage of magnetic flux to the outside is prominent.

Figure 3:
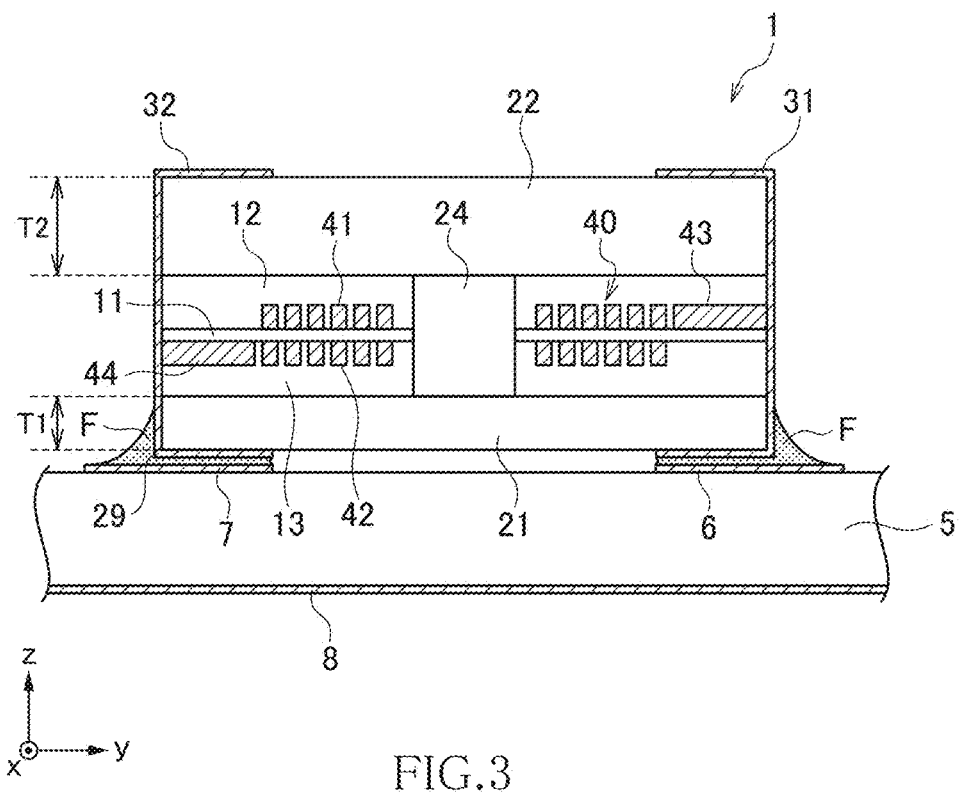
FIG. 3 is a schematic cross-sectional view of a circuit board on which the coil component is mounted.

FIG. 3 is a schematic cross-sectional view of a circuit board on which the coil component 1 is mounted.

The circuit board illustrated in FIG. 3 has a mounting substrate 5 and the coil component 1 mounted on the mounting substrate 5. The coil component 1 is mounted on the mounting substrate 5 such that the xy plane of the first magnetic layer 21 serving as the mounting surface faces the mounting substrate 5. Land patterns 6 and 7 are provided on the surface of the mounting substrate 5. The land patterns 6 and 7 and the first and second terminal electrodes 31 and 32 are electrically and mechanically connected to each other through solder fillets F, respectively.

A ground pattern 8 is provided on the back surface of the mounting substrate 5. The ground pattern 8 is provided so as to overlap the coil component 1 when viewed in the z-direction. The ground pattern 8 plays a role of providing a reference level of a differential signal and shielding magnetic flux leaking from the coil component 1 to the mounting substrate 5 side.

As described above, the ground pattern 8 that shields leakage magnetic flux is provided on the mounting substrate 5, so that the lower side (negative side in the z-direction) relative to the coil component 1 is less influenced by the leakage magnetic flux. On the other hand, the upper side (positive side in the z-direction) relative to the coil component 1 is made to be an open space where such a magnetic shielding member is not provided and thus tends to be much influenced by the leakage magnetic flux. However, in the coil component 1 according to the present embodiment, the thickness T2 of the second magnetic layer 22 located on the side opposite to the mounting substrate 5 when viewed from the coil layer 10 is larger than the thickness T1 of the magnetic layer 21, so that the magnetic path on the upper side of the coil layer 10 is expanded. This makes it possible to reduce leakage magnetic flux to the upper side relative to the coil component 1.

Further, in addition to an increase in the thickness T2 of the second magnetic layer 22, the position of the coil layer 10 is offset in the z-direction to reduce the thickness T1 of the first magnetic layer 21, thereby making it possible to minimize increase in the dimension of the coil component 1 in the z-direction.

As described above, in the coil component 1 according to the present embodiment, the coil layer 10 is offset in the z-direction, so that when the first magnetic layer 21 having a smaller thickness is used as the mounting side, it is possible to suppress magnetic flux from leaking upward by the second magnetic layer 22 having a larger thickness.

<Second Embodiment>

Figure 4:
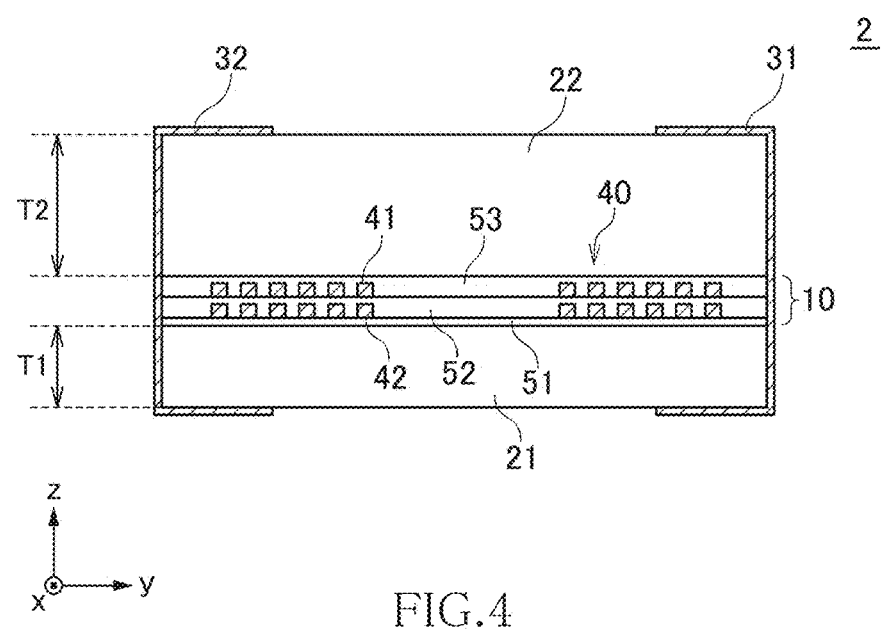
FIG. 4 is a cross-sectional view for explaining the structure of a coil component according to a second embodiment of the present invention.

FIG. 4 is a cross-sectional view for explaining the structure of a coil component 2 according to the second embodiment of the present invention.

As illustrated in FIG. 4, the coil component 2 according to the present embodiment has a configuration in which the coil layer 10 is arranged on the surface of the first magnetic layer 21 in a stacked manner. Specifically, insulating resin layers 51 to 53 are stacked in this order on the surface of the first magnetic layer 21, a spiral conductor 42 is formed between the insulating resin layers 51 and 52, and a spiral conductor 41 is formed between the insulating resin layers 52 and 53. Other configurations are basically the same as those in the coil component 1 according to the first embodiment, so the same reference numerals are given to the same elements, and overlapping description will be omitted.

In the manufacturing process of the coil component 2, first, the first magnetic layer 21 is prepared, and then the insulating resin layer 51 is formed on the surface of the first magnetic layer 21 using a spin-coating method, etc., followed by formation of the spiral conductor 42 on the surface of the insulating resin layer 51. Subsequently, the surface of the spiral conductor 42 is covered with the insulating resin layer 52 using a spin-coating method, etc., followed by formation of the spiral conductor 41 on the surface of the insulating resin layer 52. Then, the surface of the spiral conductor 41 is covered with the insulating resin layer 53 using a spin-coating method, etc., followed by bonding of the second magnetic layer 22 and formation of the first and second terminal electrodes 31 and 32, whereby the coil component 2 according to the present embodiment is completed.

As exemplified in the present embodiment, the coil component according to the present invention may not necessarily have the substrate 11, but instead may have a configuration in which the coil layer 10 is formed on the surface of the first magnetic layer 21 in a stacked manner. In this case, the insulating resin layers 51 to 53 constitute the low permeability part.

<Third Embodiment>

Figure 5:
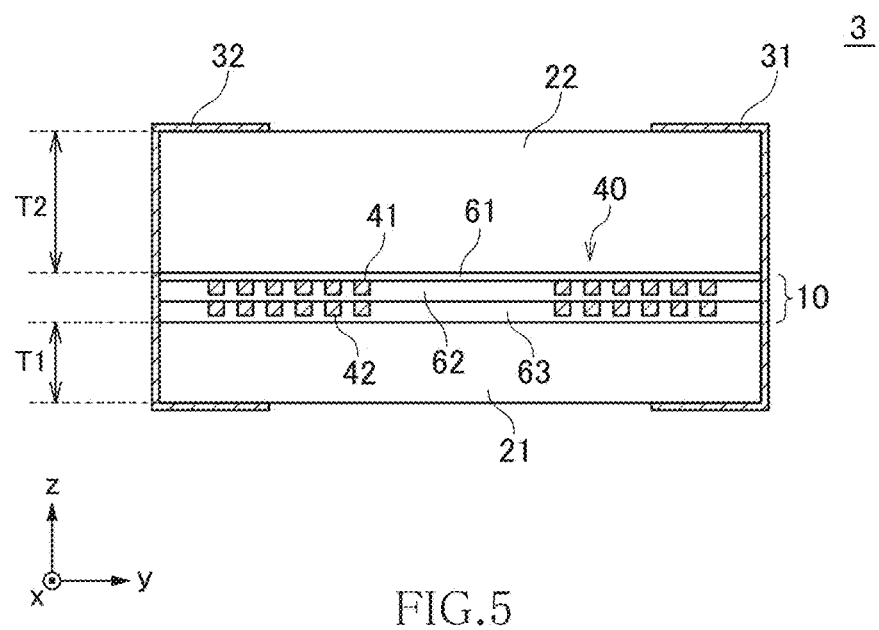
FIG. 5 is a cross-sectional view for explaining the structure of a coil component according to a third embodiment of the present invention.

FIG. 5 is a cross-sectional view for explaining the structure of a coil component 3 according to the third embodiment of the present invention.

As illustrated in FIG. 5, the coil component 3 according to the present embodiment has a configuration in which the coil layer 10 is arranged on the surface of the second magnetic layer 22 in a stacked manner. Specifically, insulating resin layers 61 to 63 are stacked in this order on the surface of the second magnetic layer 22, a spiral conductor 41 is formed between the insulating resin layers 61 and 62, and a spiral conductor 42 is formed between the insulating resin layers 62 and 63. Other configurations are basically the same as those in the coil component 2 according to the second embodiment, so the same reference numerals are given to the same elements, and overlapping description will be omitted.

In the manufacturing process of the coil component 3, first the second magnetic layer 22 is prepared, and then the insulating resin layer 61 is formed on the surface of the second magnetic layer 22 using a spin-coating method, etc., followed by formation of the spiral conductor 41 on the surface of the insulating resin layer 61. Subsequently, the surface of the spiral conductor 41 is covered with the insulating resin layer 62 using a spin-coating method, etc., followed by formation of the spiral conductor 42 on the surface of the insulating resin layer 62. Then, the surface of the spiral conductor 42 is covered with the insulating resin layer 63 using a spin-coating method, etc., followed by bonding of the first magnetic layer 21 and formation of the first and second terminal electrodes 31 and 32, whereby the coil component 3 according to the present embodiment is completed.

As exemplified in the second and third embodiments, when the coil layer 10 is formed by a stacking method, the stacking may be started from either the first magnetic layer 21 side or second magnetic layer 22 side. When the stacking of the coil layer 10 is started from the second magnetic layer 22 side as in the third embodiment, the vertical direction at the time of mounting is reversed to the vertical direction at the time of stacking. In the present embodiment, the insulating resin layers 61 to 63 constitute the low permeability part.

<Fourth Embodiment>

Figure 6:
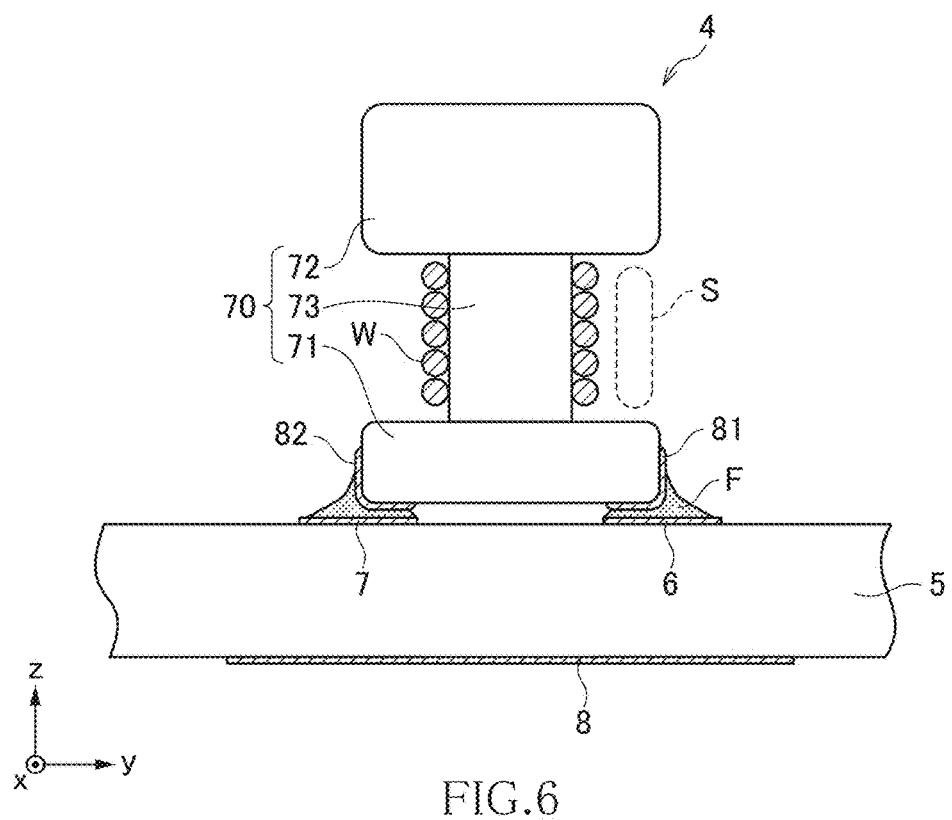
FIG. 6 is a cross-sectional view for explaining the structure of a coil component according to a fourth embodiment of the present invention.

FIG. 6 is a cross-sectional view for explaining the structure of a coil component 4 according to the fourth embodiment of the present invention.

As illustrated in FIG. 6, the coil component 4 according to the present embodiment has a configuration in which a wire W is wound around a drum-shaped core 70. The drum-shaped core 70 has a pair of flange parts 71 and 72 and a winding core part 73 connecting the flange parts 71 and 72. The wire W is wound around the winding core part 73. One end of the wire W is connected to a first terminal electrode 81 provided on the flange part 71, and the other end thereof is connected to a second terminal electrode 82 provided on the flange part 71. In the present embodiment, the wire W wound around the winding core part 73 constitutes the coil conductor part.

The coil component 4 according to the present embodiment is mounted on the mounting substrate 5 in an upright posture with the flange part 71 as the mounting surface. In a state where the coil component 4 is mounted on the mounting substrate 5, the terminal electrodes 81 and 82 are connected to the land patterns 6 and 7, respectively. A thickness T2 of the flange part 72 of the coil component 4 in the coil axis direction is larger than a thickness T1 of the flange part 71 in the coil axis direction, so that, as in the above embodiments, it is possible to suppress magnetic flux from leaking upward by the flange part 72 having a larger thickness. In the present embodiment, the flange parts 71 and 72 constitute the high permeability part, and a space S located outside the coil conductor part constituted of the wire W and sandwiched between the flange parts 71 and 72 constitutes the low permeability part.

As exemplified in the present embodiment, the coil component according to the present invention may be a coil component of a type that uses the drum-shaped core and wire. Further, a space may constitute the low permeability part.

It is apparent that the present invention is not limited to the above embodiments, but may be modified and changed without departing from the scope and spirit of the invention.

EXAMPLES

A magnet field distribution generated when current is made to flow in the coil conductor part 40 was simulated by using the coil component 1 described using FIGS. 1 to 3. The size of the coil component 1 is set such that x=1.6 mm, y=2.0 mm, and z=1.0 mm, the thickness of the substrate 11 is set to 75 μm, and the dimensions of the spiral conductors 41 and 42 in the z-direction are set to 220 μm. Further, the position of the substrate 11 in the z-direction is set to a position at a ratio of 4:5 in terms of the dimension of the coil component 1 in the z-direction. That is, the substrate 11 is offset in the z-direction such that the relationship between the distance from the center of the substrate 11 to the xy plane of the first magnetic layer 21 and distance from the center of the substrate 11 to the xy plane of the second magnetic layer 22 is set to a ratio of 4:5.

Figure 7:
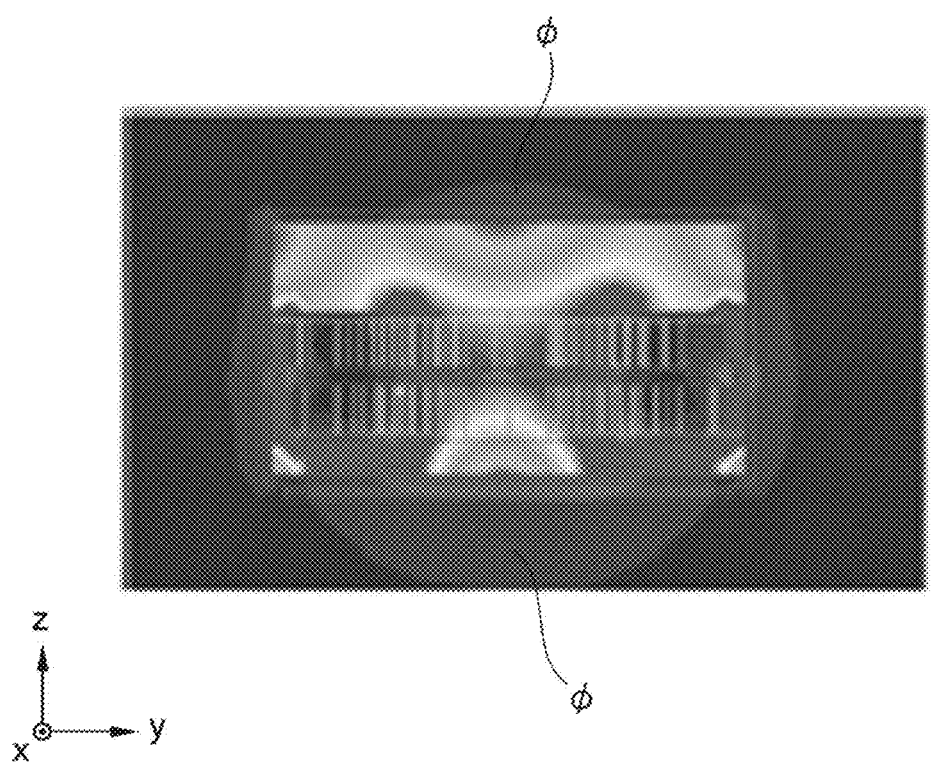
FIG. 7 is a simulation results of Examples.

The results of the simulation are illustrated in FIG. 7.

As illustrated in FIG. 7, it can be confirmed that leakage magnetic flux ϕ to the outside is less at the second magnetic layer 22 side than at the first magnetic layer 21 side. Further, spread of the leakage magnetic flux ϕ in the side surface direction (xy direction) is less than spread of the magnetic flux leaking from the mounting surface.

What is claimed is:

1. A coil component comprising:
   a coil conductor part; and
   first and second high permeability parts provided respectively on both sides of the coil conductor part in a coil axis direction,
   wherein the second high permeability part has a larger thickness in the coil axis direction than the first high permeability part,
   wherein a low permeability part that segments at least a part of a magnetic path exists between the first and second high permeability parts in an outer diameter area of the coil conductor part when viewed in the coil axis direction,
   wherein the first high permeability part comprises one of flange parts of a drum-shaped core, and
   wherein the second high permeability part comprises other one of the flange parts of the drum-shaped core.

2. The coil component as claimed in claim 1, wherein the first high permeability part has a mounting surface substantially perpendicular to the coil axis.

3. A circuit board comprising:
   a mounting substrate; and
   a coil component mounted on the mounting substrate,
   wherein the coil component includes:
      a coil conductor part; and
      first and second high permeability parts provided respectively on both sides of the coil conductor part in a coil axis direction,
   wherein the second high permeability part has a larger thickness in the coil axis direction than the first high permeability part,
   wherein a low permeability part that segments at least a part of a magnetic path exists between the first and second high permeability parts in an outer diameter area of the coil conductor part when viewed in the coil axis direction,
   wherein the first high permeability part comprises one of flange parts of a drum-shaped core, and
   wherein the second high permeability part comprises other one of the flange parts of the drum-shaped core,
   wherein the first high permeability part has a mounting surface substantially perpendicular to the coil axis, and
   wherein the coil component is mounted on the mounting substrate such that the mounting surface faces the mounting substrate.

4. The circuit board as claimed in claim 3, wherein the mounting substrate has a ground pattern formed so as to overlap the coil component.

* * * * *

UNITED STATES PATENT AND TRADEMARK OFFICE
CERTIFICATE OF CORRECTION

PATENT NO. : 10,388,452 B2  
APPLICATION NO. : 15/852662  
DATED : August 20, 2019  
INVENTOR(S) : Toshio Tomonari, Sachiko Takano and Shigeki Sato Page 1 of 1

It is certified that error appears in the above-identified patent and that said Letters Patent is hereby corrected as shown below:

On the Title Page

Item (30) should read:  
Foreign Application Priority Data  
Dec 27 2016 [JP]    2016-252588

Signed and Sealed this  
Ninth Day of June, 2020

Andrei Iancu  
*Director of the United States Patent and Trademark Office*